(12) United States Patent
Carney et al.

(10) Patent No.: US 7,944,044 B2
(45) Date of Patent: May 17, 2011

(54) SEMICONDUCTOR PACKAGE STRUCTURE HAVING ENHANCED THERMAL DISSIPATION CHARACTERISTICS

(75) Inventors: Francis J. Carney, Gilbert, AZ (US); Michael J. Seddon, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 937 days.

(21) Appl. No.: 11/575,808

(22) PCT Filed: Dec. 20, 2004

(86) PCT No.: PCT/US2004/043076
§ 371 (c)(1),
(2), (4) Date: Mar. 22, 2007

(87) PCT Pub. No.: WO2006/068642
PCT Pub. Date: Jun. 29, 2006

(65) Prior Publication Data
US 2007/0278664 A1    Dec. 6, 2007

(51) Int. Cl.
*H01L 23/12*    (2006.01)

(52) U.S. Cl. ............................ 257/706; 257/E23.001

(58) Field of Classification Search .................. 257/666, 257/672, 676, 678, E33.066, E23.031, E23.042–E23.066, 257/E21.141
See application file for complete search history.

(56) References Cited

U.S. PATENT DOCUMENTS

| | | | | |
|---|---|---|---|---|
| 5,221,642 A | * | 6/1993 | Burns | 156/233 |
| 6,255,722 B1 | * | 7/2001 | Ewer et al. | 257/676 |
| 6,975,512 B1 | * | 12/2005 | Ooi | 361/704 |
| 7,271,477 B2 | * | 9/2007 | Saito et al. | 257/686 |
| 2004/0217488 A1 | * | 11/2004 | Luechinger | 257/784 |

* cited by examiner

*Primary Examiner* — Matthew W Such
*Assistant Examiner* — Monica D Harrison
(74) *Attorney, Agent, or Firm* — Kevin B. Jackson

(57) ABSTRACT

In one embodiment, a packaged semiconductor device having enhanced thermal dissipation characteristics includes a lead frame structure and a semiconductor chip having a major current carrying or heat generating electrode. The semiconductor chip is oriented so that the major current carrying electrode faces the top of the package or away from the next level of assembly. The packaged semiconductor device further includes a non-planar, stepped or undulating attachment structure coupling the current carrying electrode to the lead frame. A high thermal conductivity mold compound and thin package profile further enhance thermal dissipation.

20 Claims, 6 Drawing Sheets

SEMICONDUCTOR PACKAGE STRUCTURE HAVING ENHANCED THERMAL DISSIPATION CHARACTERISTICS

BACKGROUND OF THE INVENTION

The present invention relates in general to semiconductor device packaging and, more particularly, to semiconductor components housed in packages having improved heat transfer characteristics.

There is a continuing demand for electronic systems with a higher functionality and smaller physical size. With this demand, there are several challenges that face electronic component designers and manufacturers. Such challenges include the management of heat generated by power semiconductor devices, which are typically arranged closely together or next to sensitive logic circuits on electronic circuit boards.

In current configurations, plastic encapsulated devices are commonly used. One problem with plastic packages is that the thermal conductivity out of a package is often limited by the plastic molding material. As a result, the majority of the heat generated by the semiconductor device is transferred through the lower part of the package next to the printed circuit board. Because the printed circuit boards are becoming more densely populated, the boards cannot properly dissipate or handle large amounts of heat. When this happens, the boards can warp, which can cause damage to both the board and the components on the board. In addition, the heat itself can damage other components on the printed circuit board or the materials that make up the board.

In view of this problem, the semiconductor industry is migrating to packages that have the capability of transferring heat out through the top of the package instead of through the printed circuit boards. Such packages may also include a heat sink attached to the top of the package to further aid in heat transfer.

One such package is the DirectFET™ package shown in a Board Mounting Application Note AN-1035 entitled "DirectFET™ Technology" dated Jan. 2002 by International Rectifier Corporation. In this design, plastic mold compound is eliminated altogether because of its perceived poor heat transfer characteristics.

This design has several disadvantages. First, because the package does not use mold compound, the semiconductor is left unprotected making it susceptible to damage or contamination. Also, this design utilizes non-standard manufacturing techniques, which adds to manufacturing cycle time and increases manufacturing costs. In addition, in certain applications this design places the main current carrying electrode (e.g., source electrode) in a down orientation or next to the printed circuit board, which lessens heat transfer capability. In other applications, this design places the main current carrying electrode in an up orientation or away from the printed circuit board, but in direct contact with an unpassivated heat sink, which is a safety concern under operation.

Accordingly, a need exists for semiconductor packages that have enhanced thermal dissipation characteristics without detrimentally impacting device reliability, safety, manufacturing cycle time, and cost.

DETAILED DESCRIPTION OF THE DRAWINGS

Figure 1:
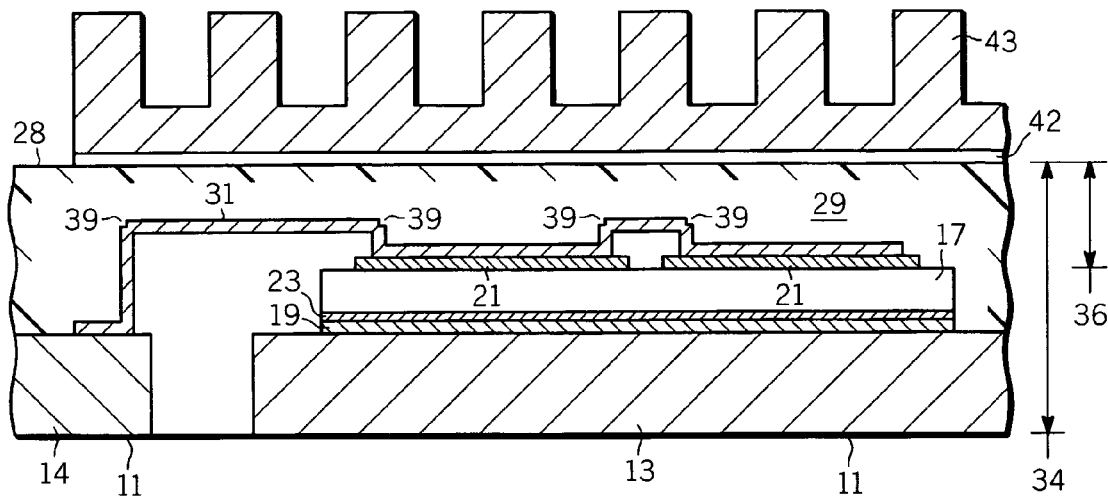
FIG. 1 illustrates an enlarged cross-sectional view of a package structure according to an embodiment of the present invention.

For ease of understanding, elements in the drawing figures are not necessarily drawn to scale, and like element numbers are used where appropriate throughout the various figures. Although the invention is described using a QFN/DFN embodiment, those skilled in the art will recognize that the present invention is applicable to other types of packages as well, particularly those where enhanced heat transfer characteristics are important.

FIG. 1 shows an enlarged cross-sectional view of a packaged semiconductor structure, QFN/DFN package, leadless packaged device or package 10 having enhanced thermal dissipation or heat transfer characteristics in accordance with the present invention. Packaged device 10 includes a conductive substrate or lead frame 11, which includes a flag, plate, or die attach portion 13 and a lead, terminal, connection, or pad portion 14. Lead frame 11 comprises, for example, copper, a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, multi-layer plating such nickel-palladium and gold. Flag portion 13 and pad portion 14 are used to connect or couple to bonding pads on a next level of assembly such as a printed circuit board.

Package 10 further includes an electronic chip or semiconductor device 17, which is attached to flag 13 using a die attach layer 19. Semiconductor device 17 comprises, for example, a power MOSFET device, a bipolar transistor, an insulated gate bipolar transistor, a thyristor, a diode, an analog or digital integrated circuit, a sensor, a passive component, or other electronic device. In an exemplary embodiment, semiconductor device 17 comprises a power MOSFET device including a source, an up-source or major current carrying electrode 21, a drain, down-drain or current carrying electrode 23, and a gate or control electrode 26 (shown in FIG. 6). Source electrode 21 comprises, for example, a solderable top metal, aluminum, an aluminum alloy, or the like. Drain electrode 23 typically comprises a solderable metal layer or layers such as TiNiAg, CrNiAu, or the like. In accordance with the present invention, semiconductor chip 17 is in a major current carrying electrode or source electrode "up" configuration. That is, the major heat generating electrode (e.g., electrode 21) of semiconductor chip 17 is oriented away from or opposite from the side of package 10 that will be attached to the next level assembly. This orientation promotes heat transfer out of top surface 28 of package 10, instead of through the next level of assembly or through the chip itself.

An attachment structure, undulating, stepped, or non-planar attachment structure or conductive clip or strap 31 is coupled to source electrodes 21 and pad portion 14 to provide an electrical path between semiconductor chip 17 and pad portion 14. Clip 31 comprises, for example, rigid copper or a copper alloy and is optionally plated with silver for either solder attachment or conductive epoxy attachment. In the embodiment shown and in accordance with the present invention, clip 31 preferably is undulating, stepped or non-planar so that portions of clip 31 are closer to top surface 28 of package 10 and not in contact with semiconductor chip 17. This provides a reduced thermal resistance path for improved conductive heat transfer away from semiconductor chip 34 compared to a flat or planar clip. Preferably, at least about 50% of the surface area of clip 31 is in contact with electrode 21, and the balance of the surface area is that portion of clip 31 undulating or stepped away from electrode 21. Preferably, clip 31 has at least 2 steps. Optional attachment or interconnect schemes for control electrode 26 are shown and described in conjunction with FIGS. 6 and 7.

An encapsulating or passivating layer 29 is formed over lead frame 11, semiconductor chip 17, and at least portions of clip 31 using a single cavity or overmolding process. In accordance with the present invention, encapsulating layer 29 comprises a high thermal conductivity mold compound. Preferably, encapsulating layer 29 comprises a mold compound having a thermal conductivity greater than about 3.0 Watts/MK. Suitable high conductivity mold compounds are available from Sumitomo Plastics America of Santa Clara, Calif. (e.g., EMEA700 series) and Hitachi Chemical of Santa Clara, Calif. (e.g., a CEL 9000 series mold compound).

Preferably, package 10 has an overall height 34 less than about 1.10 millimeters. In a more preferred embodiment, height 34 is less than about 0.80 millimeters. Additionally, the thickness of encapsulating layer 29 above semiconductor chip 17 is less than about 0.53 millimeters. These dimensions together with undulating clip 31, the orientation of major current carrying electrode 21, and the high conductivity mold compound provide for an enhanced heat transfer effect. In particular, thermal studies evaluating a comparable sized package 10 to a DirectFET™ product showed that a package 10 according to the present invention assembled with a mold compound having a thermal conductivity greater that or equal to about 3.0 Watts/mK, and a height 34 of less than about 0.80 millimeters had an equal or better thermal resistance (junction to top of package) characteristic.

Undulating clip 31 is shown with one or more optional mold lock features or notches 39, which are used to provide better adhesion between encapsulating layer 29 and clip 31. More or fewer notches 39 may be used. Additionally, package 10 includes an optional heat sink device 43, which is attached to package 10 with, for example, a high conductivity epoxy material 42, such as a CEL9750 HFLO(AL3) or a CEL9210 HFLO(AL2) epoxy available from Hitachi Chemical, or an EMF 760a epoxy available from Sumitomo Plastics America. It is understood that heat sink 43 is an option for all package embodiment described including those shown in FIGS. 2-5 hereinafter. In applications where safety is a concern, heat sink 43 is optionally coated with an insulating material such as a thermal grease.

Figure 2:
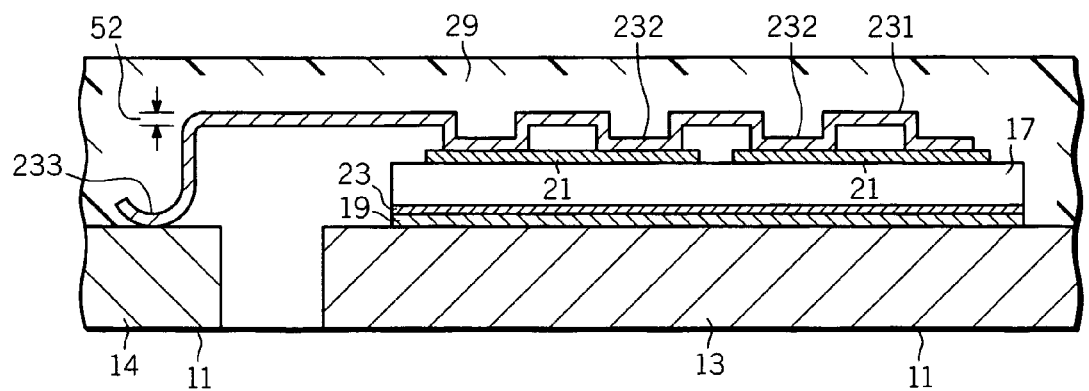
FIG. 2 illustrates an enlarged cross-sectional view of a package structure according to a second embodiment of the present invention.

FIG. 2 shows an enlarged cross-sectional view of a packaged semiconductor structure, QFN/DFN package, leadless packaged device, or package 100 according to a second embodiment of the present invention. Package 100 is similar to package 10 except that instead of undulating clip 31, an undulating or non-planar attachment structure or ribbon bond(s) 231 is used to couple major current carrying electrode 21 semiconductor chip 17 to pad portion 14.

Ribbon bond 231 refers to a flexible rectangular shaped conductor, wherein a width 51 of ribbon bond 231 (shown in FIG. 7) is greater than a thickness 52 of ribbon bond 231. Suitable materials for ribbon bond 231 include gold, aluminum, silver, palladium, copper or the like. Attachment of ribbon bond 231 typically includes ultrasonic wedge bonding end 232 to source electrodes 21, and wedge bonding end 233 to pad portion 14. In one embodiment, ribbon bond 231 is formed having a thickness of about twenty five microns and a width of about seventy five microns. Alternatively, ribbon bond 231 is typically formed to a thickness 52 of about six microns to fifty microns and a width 52 of about fifty microns to fifteen hundred microns wide. One advantage of the embodiments of FIGS. 1 and 2 is that the top side of packages 10 and 100 are electrically insulated so that the safety issues associated with prior art structure are avoided.

Figure 3:
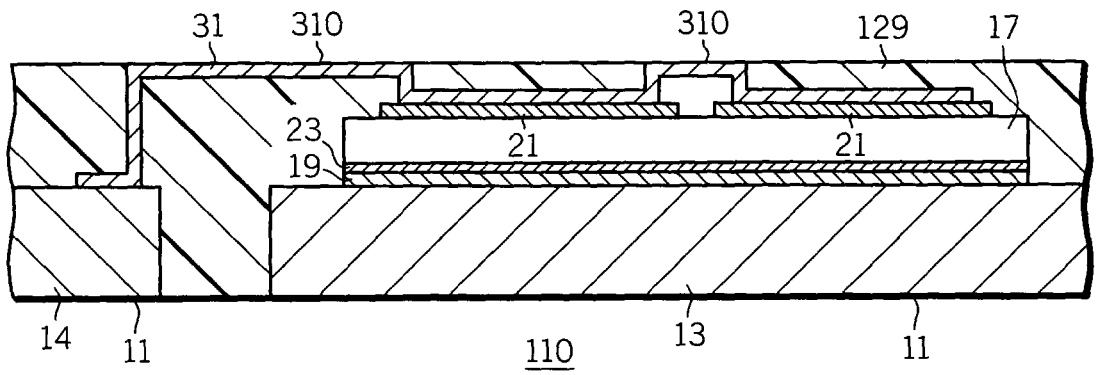
FIG. 3 illustrates an enlarged cross-sectional view of a package structure according to a third embodiment of the present invention.

FIG. 3 shows an enlarged cross-sectional view of a packaged semiconductor structure, QFN/DFN package, leadless packaged device, or package 110 according to a third embodiment of the present invention. Package 110 is similar to package 10 except that in package 110, an encapsulating layer 129 covers only a portion of undulating clip 31. That is, in package 110, portions 310 of clip 31 are left exposed, which further enhances the heat transfer characteristics of the package while semiconductor chip 17 is still covered or passivated by encapsulating layer 129. In this embodiment, encapsulating layer 129 preferably comprises materials similar to encapsulating layer 29.

Figure 4:
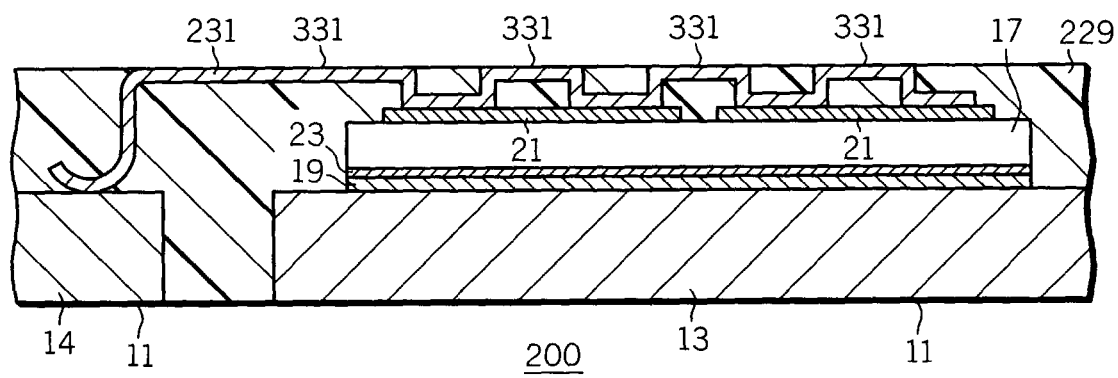
FIG. 4 illustrates an enlarged cross-sectional view of a package structure according to a fourth embodiment of the present invention.

FIG. 4 shows an enlarged cross-sectional view of a packaged semiconductor structure, QFN/DFN package, leadless packaged device, or package 200 according to another embodiment of the present invention. Package 200 is similar to package 100 except that in package 200, an encapsulating layer 229 covers only a portion of attachment structure or ribbon bond 231. That is, in package 200, portions 331 of ribbon bond 231 are left exposed, which further enhances the heat transfer characteristics of the package while semiconductor chip 17 is still covered or passivated by encapsulating layer 129. In this embodiment, encapsulating layer 229 preferably comprises materials similar to encapsulating layer 29.

In a preferred method for forming packages 110 and 200, after attachment structures 31 and 231 are formed, the assemblies are placed in a molding apparatus so that portions 310 and 331 contact or adjoin a surface of the mold cavity. The surface of the mold cavity acts as a mask to prevent encapsulating material 129 and 229 from covering portions 310 and 331.

Figure 5:
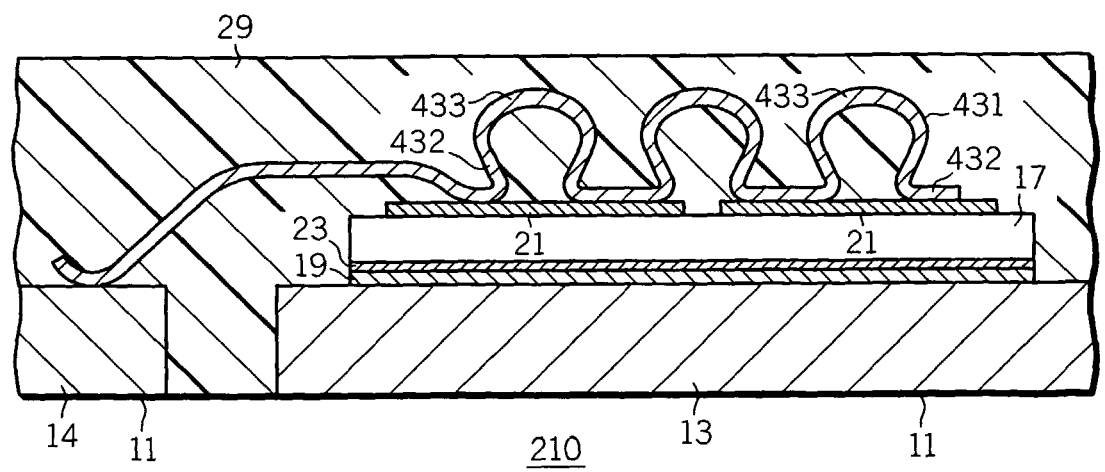
FIG. 5 illustrates an enlarged cross-sectional view of a package structure according to a fifth embodiment of the present invention.

FIG. 5 shows an enlarged cross-sectional view of a packaged semiconductor structure, QFN/DFN package, leadless packaged device, or package 210 according to a further embodiment of the present invention. Package 210 is similar to package 100 except that in package 210, an undulating or non-planar attachment structure or ribbon bond 431 is used having an omega or substantially omega-like shape. That is ribbon bond 431 includes base portions 432 and upper portions 433 above semiconductor chip 17, wherein the base portions 432 have a width less than the width of upper portions 433. Omega shaped ribbon bond 431 provides an undulating attachment structure that has more conductive surface area, which provides for a package with enhanced heat transfer characteristics. In an alternative embodiment, portions of omega shaped ribbon bond 431 are exposed similar to the packages shown in FIGS. 3 and 4.

Figure 6:
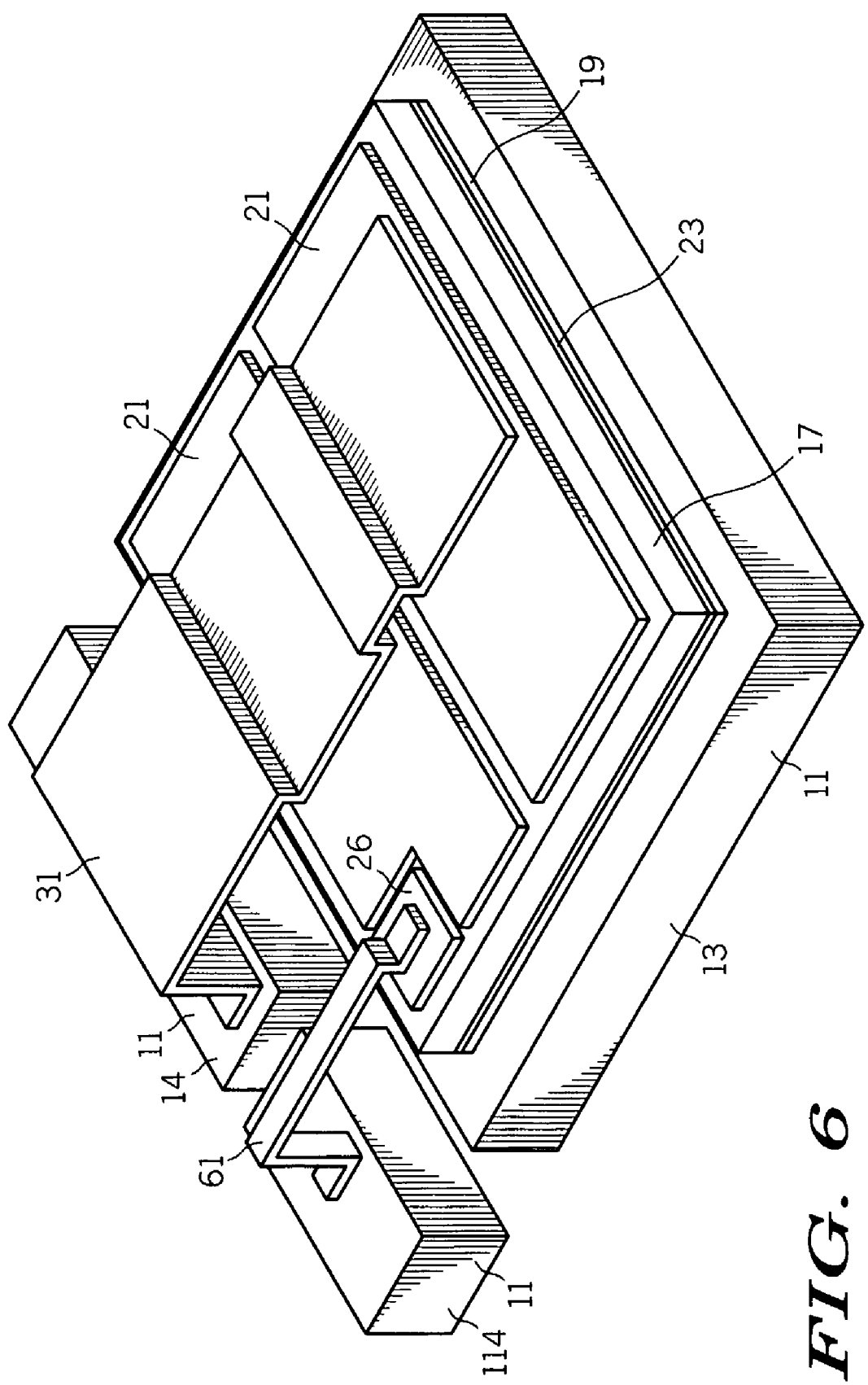
FIG. 6 illustrates an embodiment of an interconnect scheme for the package structures of FIGS. 1 and 4.

FIGS. 6-9 show embodiments of different attachment structure schemes for use with the present invention prior to an encapsulation step. FIG. 6 shows lead frame 11 and semiconductor chip 17 of FIG. 1 with the addition of control electrode attachment structure 61 coupling a control electrode 26 on semiconductor chip 17 to pad portion 114. In this embodiment, control electrode attachment structure 61 comprises a ribbon bond. In general, an area of control electrode 26 is selected to be approximately three times the width by three times the thickness of the ribbon bond. One advantage to ribbon bond 61 is that compared to contact areas required for wire bonds, ribbon bond area can be smaller without sacrificing manufacturability, reliability or strength.

Figure 7:
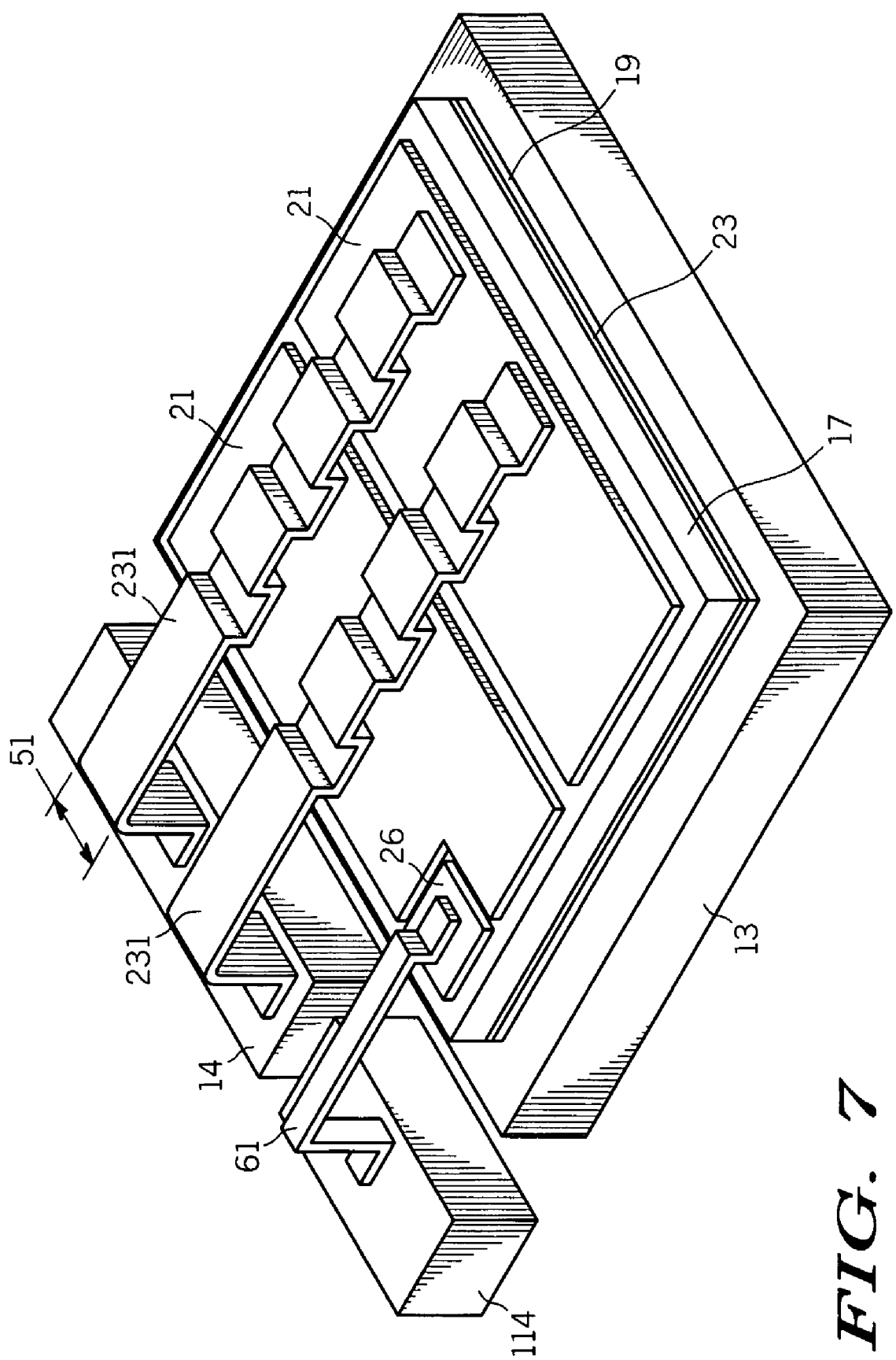
FIG. 7 illustrates another embodiment of an interconnect scheme for the package structures of FIGS. 1 and 4.

FIG. 7 shows lead frame 11 and semiconductor chip 17 of FIG. 2 with the addition of ribbon bond 61 as described in conjunction with FIG. 6. FIG. 7 further shows a plurality of or multiple ribbon bonds 231, and includes width 51 as referenced in paragraph [0025].

Figure 8:
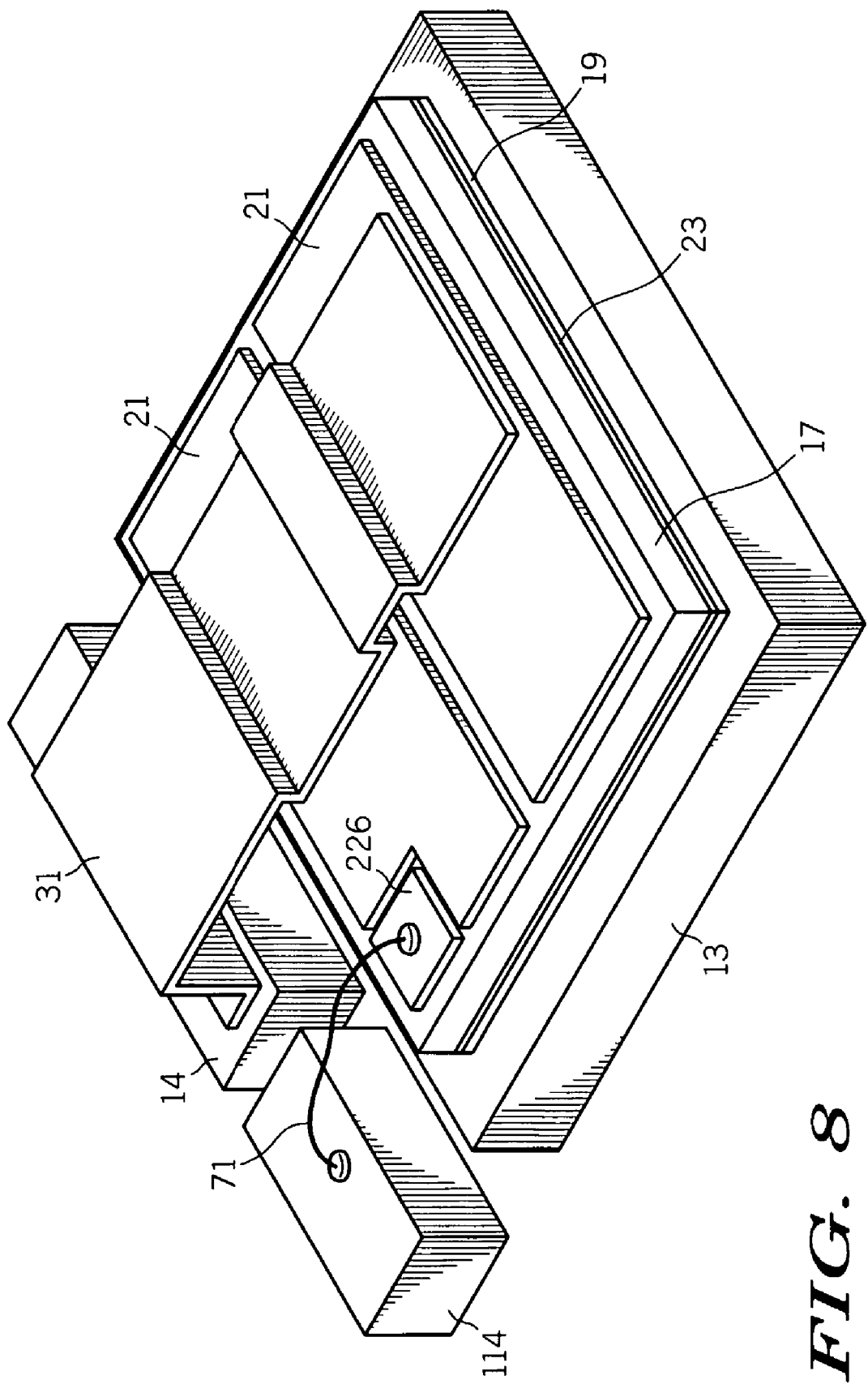
FIG. 8 illustrates an embodiment of an interconnect scheme for the package structures of FIGS. 2 and 3.

FIG. 8 shows lead frame 11 and semiconductor chip 17 of FIG. 1 with the addition of wire bond 71, which is an attachment structure coupling a control electrode 226 on semiconductor chip 17 to a pad portion 114 of lead frame 11. In this embodiment, control electrode 226 comprises a metal suitable for wire bonding such as aluminum or an aluminum alloy. Wire bond 71 is formed using conventional wire bonding techniques, and comprises for example, aluminum or gold. In a preferred embodiment, wire bond 71 has a loop height that is less than the height of undulating clip 31 so that wire bond 71 is not exposed in the embodiment of FIG. 3.

Figure 9:
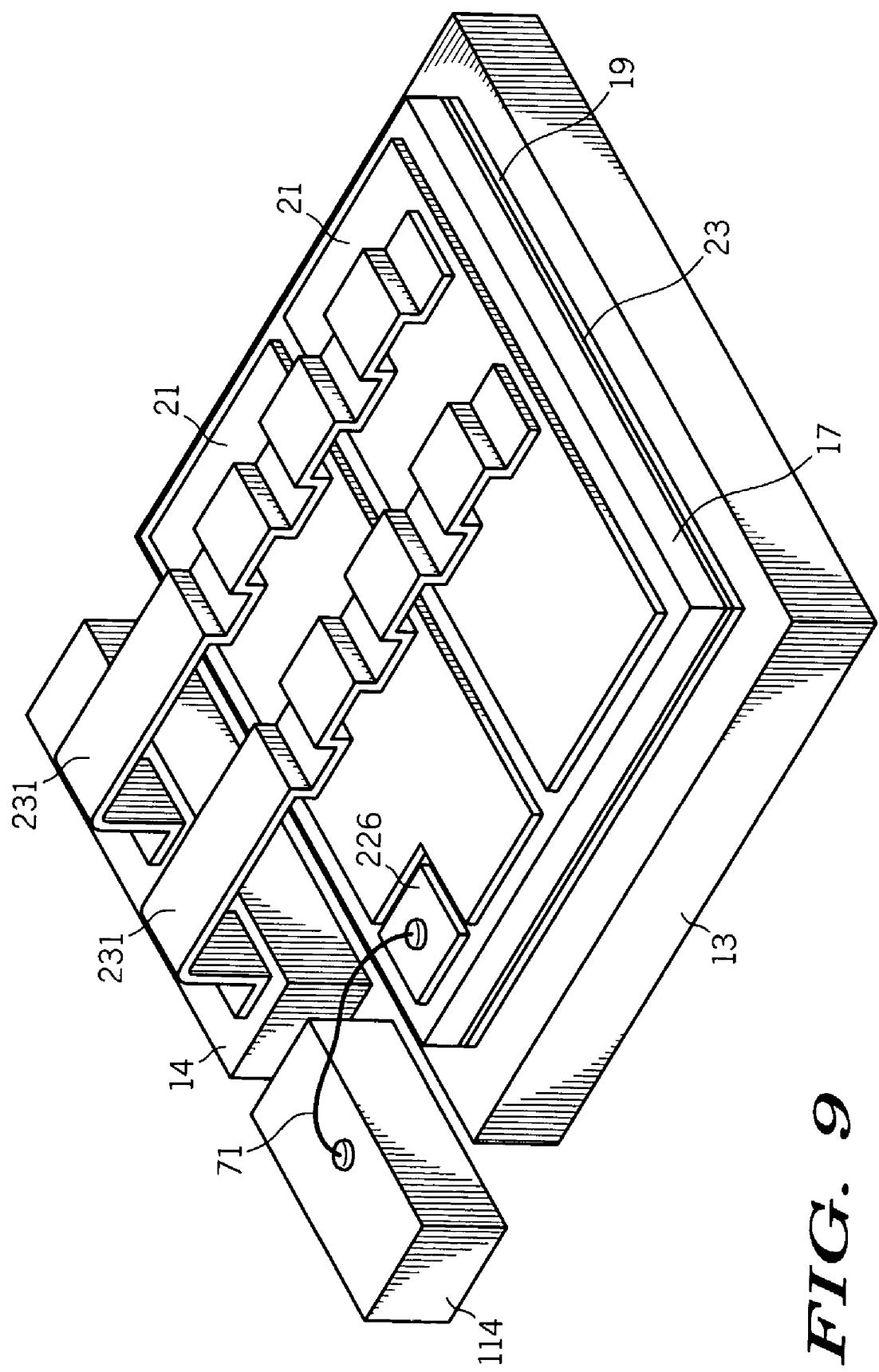
FIG. 9 illustrates another embodiment of an interconnect scheme for the package structures of FIGS. 2 and 3.

FIG. 9 shows lead frame 11 and semiconductor chip 17 of FIG. 2 with the addition of wire bond 71 coupling control electrode 226 on semiconductor chip 17 to pad portion 114 of lead frame 11. In this embodiment, control electrode 226 comprises a metal suitable for wire bonding such as aluminum or an aluminum alloy. Wire bond 71 is formed using conventional wire bonding techniques, and comprises for example, aluminum or gold. In a preferred embodiment, wire bond 71 has a loop height that is less than the height of ribbon bond 231 so that wire bond 71 is not exposed in the embodiment of FIG. 4.

By now it should be appreciated that there has been provided a semiconductor package structure that has enhanced thermal dissipation or heat transfer characteristics. The package includes an electronic chip that is orientated so that the heat generating or major current carrying electrode is away from the side of the package intended to attach to a next level of assembly. This provides an improved thermal path through the top of the package. The package further includes an undulating attachment structure that places a portion of the attachment structure closer to the top of the package thereby further reducing the thermal resistance path. In addition, the package incorporates a high thermal conductivity mold compound (greater than about 3.0 W/mK) and a thin profile (less than about 1.10 millimeters) to further enhance thermal dissipation. In an alternative embodiment, a portion of the undulating attachment structure is exposed to further enhance thermal dissipation. In, an additional embodiment, the undulating attachment structure has an omega-like shape to provide more conductive surface area for heat transfer. In a still further embodiment, a heat sink device is added to the top of the package to further enhance thermal dissipation.

What is claimed is:

1. A semiconductor package comprising:
    a conductive substrate having a flag portion and a pad portion;
    an electronic chip coupled to the flag portion, wherein the electronic chip includes a major current carrying electrode on a surface opposite the flag portion;
    a stepped clip structure coupling the major current carrying electrode to the pad portion, wherein the stepped clip structure has a first step that overlies a major surface of the electronic chip without extending over an edge of the electronic chip and a second step that overlies the edge of the electronic chip; and
    an encapsulating layer covering the electronic chip and at least a portion of the stepped clip structure, wherein an outer surface of the first step is exposed to provide enhanced thermal dissipation.

2. The package of claim 1, wherein the stepped clip has a surface area, and wherein at least 50% of the surface area is attached to the major current carrying electrode.

3. The package of claim 1, wherein the stepped clip comprises a third step that overlies the major surface without extending over an edge of the electronic chip, and wherein the third step has an outer surface that is exposed through the encapsulating layer.

4. The package of claim 3, wherein the stepped clip has a surface area, and wherein at least 50% of the surface area is attached to the major current carrying electrode.

5. The package of claim 1, wherein the encapsulating layer has a thermal conductivity greater than or equal to about 3.0 Watts/mK.

6. The package of claim 1 wherein the electronic chip further includes a control electrode, and wherein the conductive substrate further includes a second pad portion, and wherein a second attachment structure couples the control electrode to the second pad portion.

7. The package of claim 6, wherein the second attachment structure includes a ribbon bond.

8. The package of claim 6, wherein the second attachment structure includes a wire bond.

9. The package of claim 1, wherein the stepped clip includes a mold lock.

10. The package of claim 1 further comprising a heat sink attached to an upper surface of the semiconductor package.

11. A semiconductor package having enhanced thermal dissipation comprising:
    a lead frame including a terminal portion;
    a semiconductor device having a first electrode on a surface;
    a stepped attachment structure coupled to the first electrode and the terminal portion, wherein the stepped attachment structure has at least one step that overlies the surface without extending over an edge of the semiconductor device; and
    a passivating layer covering the semiconductor device and at least a portion of the stepped attachment structure, wherein the at least one step includes an upper surface that is exposed through the passivating layer.

12. The semiconductor package of claim 11, wherein the stepped attachment structure comprises a stepped clip having at least two steps.

13. The semiconductor package of claim 12, wherein the stepped attachment structure has a surface area, and wherein at least 50% of the surface area is attached to the first electrode.

14. The semiconductor package of claim 11, wherein the passivating layer comprises a mold compound having a thermal conductivity greater than or equal to about 3.0 Watts/mK, and wherein the semiconductor package has a height less than about 1.10 millimeters.

15. An electronic package having enhanced thermal dissipation comprising:
- a semiconductor die having a major current carrying electrode and a control electrode, wherein the major current carrying electrode is oriented away from and opposite that side of electronic package that will be attached to a next level assembly;
- a stepped clip structure coupled to the major current carrying electrode, wherein the stepped clip structure includes at least one step that overlies the major current carrying electrode without overlapping an edge of the semiconductor die;
- a second attachment structure coupled to the control electrode; and
- an encapsulating layer covering the semiconductor die and at least a portion of the stepped attachment structure, wherein the at least one step includes an upper surface that is exposed through the encapsulating layer.

16. The electronic package of claim 15, wherein the stepped clip structure further comprises at least two steps, and wherein the at least two steps overlie the major current carrying electrode without overlapping the edge of the semiconductor die, and wherein the at least two steps have upper surfaces exposed through the encapsulating layer.

17. The electronic package of claim 15, wherein the stepped clip structure has a surface area, and wherein at least 50% of the surface area is coupled to the major current carrying electrode.

18. The electronic package of claim 15, wherein the second attachment structure comprises a ribbon bond.

19. The electronic package of claim 15, wherein the second attachment structure comprises a wire bond.

20. The electronic package of claim 15, wherein the encapsulating layer comprises a mold compound material having a thermal conductivity greater than or equal to about 3.0 Watts/mK.

* * * * *